(12) United States Patent
Kozlowski et al.

(10) Patent No.: US 6,900,839 B1
(45) Date of Patent: May 31, 2005

(54) HIGH GAIN DETECTOR AMPLIFIER WITH ENHANCED DYNAMIC RANGE FOR SINGLE PHOTON READ-OUT OF PHOTODETECTORS

(75) Inventors: Lester J. Kozlowski, Simi Valley, CA (US); William E. Tennant, Thousand Oaks, CA (US)

(73) Assignee: Rockwell Science Center, LLC, Thousand Oaks, CA (US)

( * ) Notice: Subject to any disclaimer, the term of this patent is extended or adjusted under 35 U.S.C. 154(b) by 929 days.

(21) Appl. No.: 09/675,487

(22) Filed: Sep. 29, 2000

(51) Int. Cl.⁷ .......................... H04N 3/14; H04N 5/335
(52) U.S. Cl. ...................................... 348/301; 348/241
(58) Field of Search ................................ 348/300, 301, 348/302, 308, 312, 317, 241, 314, 295, 297, 294, 298; 250/208.1, 214 R, 216, 370.08, 338.1; 330/85

(56) References Cited

U.S. PATENT DOCUMENTS

| | | |
|---|---|---|
| 4,249,122 A | 2/1981 | Widlar |
| 4,463,383 A | 7/1984 | Sonoda et al. |
| 4,466,018 A | 8/1984 | Sonoda et al. |
| 4,676,761 A | 6/1987 | Poujois |
| 4,794,247 A * | 12/1988 | Stineman, Jr. .......... 250/214 A |
| 5,043,820 A | 8/1991 | Wyles et al. |
| 5,055,667 A | 10/1991 | Sayag |
| 5,083,016 A | 1/1992 | Wyles et al. |
| 5,128,534 A | 7/1992 | Wyles et al. |
| 5,146,302 A | 9/1992 | Kumada |
| 5,296,696 A | 3/1994 | Uno |
| 5,345,266 A | 9/1994 | Denyer et al. |
| RE34,802 E | 11/1994 | Sayag et al. |
| 5,382,977 A | 1/1995 | Kozlowski et al. |
| RE34,908 E | 4/1995 | Wyles et al. |
| 5,471,515 A | 11/1995 | Fossum et al. |
| 5,541,402 A | 7/1996 | Ackland et al. |
| 5,576,763 A | 11/1996 | Ackland et al. |
| 5,587,596 A | 12/1996 | Chi et al. |
| 5,608,243 A | 3/1997 | Chi et al. |
| 5,627,112 A | 5/1997 | Tennant et al. |
| 5,665,959 A * | 9/1997 | Fossum et al. .......... 250/208.1 |
| 5,929,434 A * | 7/1999 | Kozlowski et al. ..... 250/214 A |
| 5,933,190 A | 8/1999 | Dierickx et al. |
| 6,037,577 A * | 3/2000 | Tanaka et al. .......... 250/208.1 |
| 6,064,431 A | 5/2000 | Ueno |
| 6,147,340 A * | 11/2000 | Levy ...................... 250/214 R |
| 6,342,920 B2 * | 1/2002 | Ueno ......................... 348/303 |
| 6,424,375 B1 * | 7/2002 | Fowler ...................... 348/241 |
| 6,624,850 B1 * | 9/2003 | Guidash ..................... 348/308 |

OTHER PUBLICATIONS

R.H. Dyck and G.P. Weckler, "Integrated Arrays Of Silicon Photodetectors For Image Sensing", IEEE Trans. Electron Devices, ED–15, Apr. 1968, pp. 196–201.

(Continued)

*Primary Examiner*—Tuan Ho
*Assistant Examiner*—Yogesh Aggarwal
(74) *Attorney, Agent, or Firm*—Reed Smith LLP

(57) ABSTRACT

An ultra-low noise, high gain interface pixel amplifier is provided with capability for single-photon readout of standard photodetectors at high electrical bandwidths for diverse spectral bandpass from the x-ray to long IR bands. The detector charge modulates a source follower whose output is double sampled to remove correlated noise by a compact stage that also provides optimum level shift for subsequent amplification of the full signal excursion. The level-shifted signal finally drives a compact amplifier that generates a robust end-to-end transimpedance. Single-photon readout of photodetectors at high electrical bandwidths in small pixel areas is thereby facilitated.

13 Claims, 4 Drawing Sheets

OTHER PUBLICATIONS

J.D. Plummer and J.D. Meindl, "MOS Electronics For A portable Reading Aid For The Blind", IEEE J. Solid–State Circuits, SC–7, Apr. 1972, pp. 111–119.

N. Koikke, I. Takemoto,K. Satoh, S. Hanamura, S. Nagahara and M. Kubo, "MOS Area Sensor: Part I—Design Consideration And Performance Of An n–p–n Structure 484 × 384 Element Color MOS Imager", IEEE Trans Electron Devices, ED–27 (8), Aug. 1980, pp. 1676–1681.

S. Ohba, M. Nakai, H. Ando, S. Hanamura, S. Shimada, K. Satoh, K. Takahashi, M. Kubo and T. Fujita, "MOS Area Sensor: Part II—Low–Noise MOS Area Sensor With Antiblooming Photodiodes", IEEE Trans. Electron Devices, ED–27 (8) Aug. 1980, pp. 1682–1687.

EG&G Reticon Sales Catalog, *Image Sensing and Solid State Camera Products 1994/1995*. Solid State Image Sensor Array Specification For Part No.: RAO256B.

EG&G Reticon Sales Catalog, *Image Sensing and Solid State Camera Products 1994/1995*. *High–Speed*Solid State Image Sensor Array Specification For Part No.: RA2568N.

EG&G Reticon Sales Catalog, *Image Sensing and Solid State Camera Products 1994/1995*. Solid State Sensor Arrays Specification For Part Nos.: RA0100A/RA0128N.

H. Ando, S. Ohba, M. Nakai, T. Ozaki, M. Ozawa, K. Ikeda, T. Masuhara, T. Imaide, I. Takemoto, T. Suzuki and T. Fukita, Design Consideration And Performance Of A New MOS Imaging Device, IEEE Trans. On Elec. Dev., ED–32 (8), Aug. 1985, pp. 1484–1489.

N. Tanaka, T. Ohmi and Y. Nakamura, "A Novel Bipolar Imaging Device With Self–Noise Reduction Capability", IEEE Trans. Elec. Dev., 36 (1), Jan. 1989, pp. 31–38.

G.P. Weckler, "Storage Mode Operation Of A Phototransistor And Its Adaptation To Integrated Arrays Foe Image Detection", IEDM, Oct. 1996. (Abstract Only—No known paper available from professional document delivery services).

N. Tanaka, T. Ohmi, Y. Nakamura and S. Matsumoto, "A Low–Noise Bi–CMOS Linear Imager Sensor With Auto–Focusing Function", IEEE Trans. Elec. Dev., 36 (1), Jan. 1989, pp. 39–45.

N. Tanaka, S. Hashimoto, M. Shinohara, S. Sugawa, m. Morishita, S. Matsumora, Y. Nakamura and T. Ohmi, A 310k Pixel Bipolar Imager (BASIS), ISSCC 1989.

G.P. Weckler, "Charge Storage Lights The Way For Solid–State Image Sensors", Electronics, May 1, 1967, pp. 75–78.

G.P. Weckler, "Operation of p–n Junction Photodetectors In A Photon Flux Integrating Mode", IEEE Journal Of solid State Circuits, vol. SC–2, No. 3, Sep. 1967, pp. 65–73.

G.P. Weckler and R.H. Dyck, "Integrated Arrays Of Silicon Photodetectors For Image Sensing", WESCON, Aug. 22–25, 1967, pp. 1–8.

L.J. Kozlowski, J. Luo, W.E. Kleinhans and T. Lui, "Comparison Of Passive And Active Pixel Schemes For CMOS Visible Imagers", SPIE, vol. 3360, Apr. 1998.

Ming–Jer Chin, Yen–Bin Gu, Terry Wu, Po–Chin Hsu and Tsung–Hann Liu, "Weak Inversion Charge Injection In Analog MOS Switches", IEEE Journal Of Solid–State Circuits, vol. 30, No. 5, May 1995, pp. 604–606.

Peter W. Fry, Peter J. W. Noble and Robert J. Rycroft, "Fixed Pattern Noise In Photomatrices", IEEE Journal Of Solid–State Circuits, vol. SC–5, No. 5, Oct. 1970, pp. 250–254.

Degrauwe, et al., "A Micropower CMOS–Instrumentation Amplifier", IEEE Journal Of Solid–State Circuits, vol. SC–20, No. 3 Jun. 1985, pp. 805–807.

Letter Dated Jul. 31, 1998, From Gener Weckler, RAD–I–CON Imaging Corp., addressed to Mark Wettler.

Chamberlin, et al., "A Novel Wide Dynamic Range Silicon Photodetector And Linear—Imaging Array", IEEE Transactions On Electron Devices, Vo. ED–31, No. 2, Feb. 1984, pp. 175–182.

L.J. Kozlowski, D. Standley, J. Luo. A Tomasini, A. Gallagher, R. Mann, B.C. Hsieh, T. Liu and W.E. Kleinhans, "Theoretical Basis And Experimental Confirmation: Why A CMOS Imager Is Superior To A CD", SPIE Conference On Infrared Technology And Applications XXV, Orlando, Fla, Apr. 1999, vol. 369, pp. 388–396.

* cited by examiner

HIGH GAIN DETECTOR AMPLIFIER WITH ENHANCED DYNAMIC RANGE FOR SINGLE PHOTON READ-OUT OF PHOTODETECTORS

The present application is related to U.S. patent application Ser. 09/675,278 entitled "SELF-ADJUSTING ADAPTIVE MINIMAL NOISE INPUT AMPLIFIER", filed Sep. 29, 2000; and is also related to U.S. Pat. No. 6,504,141, entitled "ADAPTIVE AMPLIFIER CIRCUIT WITH ENHANCED DYNAMIC RANGE", filed Sep. 29, 2000; the disclosures of which are herein incorporated by reference.

BACKGROUND OF THE INVENTION

1. Field of the Invention

This invention relates to ultra-low noise photon detection in low-light-level conditions and, specifically, to low-noise, high-gain, wide dynamic range pixel amplifiers with high bandwidth for single photon readout of various photodetectors in imaging arrays.

2. Description of the Related Art

Optical sensors transform incident radiant signals in the X-ray ($\lambda$<0.00 $\mu$m), ultraviolet ($\lambda$=0.001–0.4 $\mu$m), visible ($\lambda$=0.4–0.8 $\mu$m), near infrared (IR) ($\lambda$=0.8–2 $\mu$m), shortwave IR ($\lambda$=2.0–2.5 $\mu$m), mid IR ($\lambda$=2.5–5 $\mu$m), and long IR ($\lambda$=5–20 $\mu$m) bands into electrical signals that are used for data collection, processing, storage and display, such as real-time video. Available conventional photodetectors such as photodiodes and photoconductors are inexpensive, exhibit bandwidths that support current video frame rates, are sensitive to wavelengths well into the long IR band, and exhibit a high degree of uniformity from pixel to pixel when used in an imaging array. However, these photodetectors have no gain, i.e. each incident photon generates, at most, a single electron. Thus, these imaging systems work well only in moderate to bright light conditions. At low light levels, they provide electrical signals that are too small to be read-out by conventional readout circuits.

In conditions of low ambient light, the standard photodetector is often replaced with an avalanche photodiode that provides significant gain such that conventional read-out circuits, such as charge coupled devices, i.e. CCDs, can read out the amplified signal at video frame rates with a high signal-to-noise ratio (SNR). The fabrication of avalanche photodiodes is much more difficult and expensive than standard photodetectors because they must simultaneously exhibit very high controlled gain and very low noise. Furthermore, currently available avalanche photodiodes exhibit relatively poor uniformity, are constrained to shorter wavelengths than standard photodetectors (0.7 $\mu$m), and have limited sensitivity due to their relatively low quantum efficiency. Imaging intensified systems use an array of avalanche photodiodes or micro-channel plates to drive respective display elements such as CCDs or phosphors, and have even lower wavelength capabilities (approximately 0.6 $\mu$m max) due to the limitations of the photodiode.

Chamberlain et al. "A Novel Wide Dynamic Range Silicon photodetector and Linear Imaging Array" IEEE Transactions on Electron Devices, Vol. ED-31, No. 2, February 1984, pp. 175–182, herein incorporated by reference, describes a gate modulation technique for single photon read-out of standard photodetectors with wide dynamic range. Chamberlain provides a high-gain current mirror that includes a load FET (Field Effect Transistor) whose gate is connected to its drain to ensure sub-threshold operation. The signal from the photodetector is injected into the load FET thereby producing a signal voltage at the gate of a gain FET with high transconductance. This signal modulates the gain FETs gate voltage, which is read out and reset via a FET switch. The key benefit of this approach is that a detecting dynamic range of more than $10^7$ for each detector in the array is produced. Unfortunately, the circuit is highly sensitive to variations in the threshold voltage of the various transistors. The pixel-to-pixel $V_T$ non-uniformity associated with standard silicon CMOS fabrication processes degrades the instantaneous dynamic range of the imaging array even as the circuit's logarithmic characteristic enhances each pixel's ability to operate over a much larger total dynamic range.

Although this specific gain modulation technique is useful for detecting signals across a broad spectral range, the front-end bandwidth severely restricts the imaging array's bandwidth. Specifically, the dominant RC time constant is the parallel combination of the photodetector's capacitance and the resistance of the load FET. In sub-threshold operation, the FET's transconductance is very low and, hence, its load resistance is very large, at $\geq 10^{15}$ ohms; the minimum resulting RC time constant is on the order of tens of seconds. Chamberlain's gate modulation technique is thus only practically useful for imaging daylight scenes or static low-light-level scenes such as stars. Furthermore, to achieve large current gain, the load FET is typically quite small. As a result, the load FET exhibits substantial 1/f noise, which under low light conditions seriously degrades the performance of the imaging array.

U.S. Pat. No. 5,933,190 discloses a circuit having a first reading transistor 23 in series with the load transistor of Chamberlain to read-out the voltage across the load transistor rather than the other leg of the current mirror. While this configuration self-biases the detectors in the imaging array, and the usable dynamic range for each pixel is still at least $10^7$, the time constant is unchanged relative to Chamberlain's teaching. Further, the instantaneous dynamic range at a specific irradiance across an imaging array having pixels of such design is still highly sensitive to the threshold uniformity from transistor to transistor. The pixel-to-pixel $V_T$ non-uniformity associated with standard silicon CMOS fabrication processes degrades the instantaneous dynamic range of the imaging array even as the circuit's logarithmic characteristic enhances each pixel's ability to operate over a much larger total dynamic range. Though the '190 reference also teaches a method for reducing the non-uniformity by degrading the various transistors by applying a stressing over-voltage, this is definitely not a recommended procedure for a high-quality, long-life camera system.

U.S. Pat. No. 5,929,434 teaches an alternative current mirror configuration that suppresses the impact of the $V_T$ non-uniformity via an alternative current mirror configuration that also reads the integrated current after an integration period rather than the instantaneous voltage. The preferred embodiment minimizes, to first order, the variations in threshold non-uniformity by subtracting the non-uniformity within each pixel. Unfortunately, the pixel-to-pixel variations still dominate the imager's fixed pattern noise irrespective of background flux, depending on the MOS fabrication technology. Such pattern noise can often be larger than the signal.

The negative feedback amplifier, A1, disclosed in U.S. Pat. No. 5,929,434, significantly reduces the input impedance of the high-gain circuit and thereby enhances its bandwidth. In the case where the buffer amplifier is approximated to have infinite voltage gain and finite transconductance, the dominant pole is given by:

$$\tau_{B-L} = \frac{C_f}{g_{m_{Q1}}}$$

where $C_f$ is the effective feedback capacitance of the buffer amplifier from its output to its input. Assuming a cascoded amplifier configuration, the gate-source capacitance of Q1 is dominant and $C_f$ is set by the gate-to-source capacitance of the sub-threshold FET Q1. This is approximately given by the parasitic metal overlap capacitance. Assuming a minimum width transistor in 0.25 μm CMOS technology, for example, the minimum $C_f$ will be approximately 0.2 fF for transistors having minimum width. The resulting time constant is on the order of tenths of a second. Though this facilitates single photon sensing at roughly video frame rates, additional improvements are needed to truly support single-photon imaging.

U.S. Pat. No. 5,665,959 teaches yet another approach consisting of a digitized system wherein each pixel uses a pair of cascaded inverters with a sub-threshold transistor at its front-end to generate extremely high transimpedance. Since the small photosignal at backgrounds on the order of one electron translates to extremely high input impedance, the photosignal is effectively integrated onto the Miller capacitance of a first-stage inverter prior to being further amplified by a second stage inverter. A resulting charge-to-voltage conversion gain>1 mV/e– is hence claimed. Nevertheless, the read noise of the charge-integrating first stage will limit the SNR for many practical cases since insufficient means are provided to band-limit the first amplifier's wideband noise. The read noise for the first stage can be approximated as similar to that of a charge integrator such that:

$$N_{stage\_1} = \frac{1}{q}\sqrt{kTC_{fb} \cdot \frac{C_{det} + C_{fb}}{C_L + \frac{C_{fb} \cdot C_{det}}{C_{fb} + C_{det}}}}$$

where k is Boltzmann's constant, T is the temperature, $C_{fb}$ is the parasitic feedback capacitance of the first stage, $C_{det}$ is the photodiode capacitance and $C_L$ is the load capacitance at the amplifier's output. Assuming practical values consistent with the understanding of those skilled in the art, the detector capacitance is typically a minimum of 15 fF for the hybrid imager of the U.S. Pat. No. 5,665,959 preferred embodiment. Assuming a Miller capacitance for the first stage amplifier of 5 fF and a load capacitance of 350 fF (i.e., the storage capacitance $C_{str1}$), then the minimum read noise for the first stage will be in the range of 6 to 7 e–; this is on top of the kT/C noise generated by opening transistor switch $Q_{SW1}$ to perform the offset compensation of the composite two-stage amplifier. This performance is very good, but does not facilitate photon counting. Further, while the clocking of the two-stage amplifier facilitates large reductions in amplifier non-uniformity, this invention does not suppress the threshold variations of the load resistor at the front end.

SUMMARY OF THE INVENTION

In general, the present invention provides an ultra-low noise, high-gain pixel amplifier to facilitate single-photon read-out across the electromagnetic spectrum from the x-ray to long IR bands at video frame rates and higher. The present invention supports various types of high impedance detectors, both photovoltaic and photoconductive, and generates minimum fixed pattern noise.

More particularly, the present invention is an adaptive detector amplifier circuit comprising a high-gain detector interface with self-nulling offset suppression to simultaneously provide high gain, low offset non-uniformity and wide dynamic range. The front-end provides both high gain and wide signal bandwidth by integrating the photocharge on the detector's capacitance. The front-end also facilitates extremely low read noise by using a feedback-enhanced reset amplifier to suppress the kTC noise below 1 e–. The integrating photocharge modulates a current source whose gain-proportioned signal may be integrated during the entire integration time or for only a fraction of the integration time, at the operator's choice. This gain is adjustable, varying exponentially with gain voltage and can be set appropriately larger at small signal levels to enable sub-electron read noise even in the presence of the kTC noise of the integration capacitor.

Since the current required for high gain will be large and since variations in the threshold voltage of the modulated transistor would normally generate large non-uniformity in these large currents, the present invention incorporates an adaptive skimming circuit at the back-end to minimize the signal non-uniformity. Though the present circuit can be readily configured as an integrator with a rolling-type electronic shutter, synchronous image formation (snapshot) is facilitated by appropriately applying a global reset clock rather than a rastered reset clock. This function separates signal integration on the diode from the gain-proportioned assimilation on an integration capacitor, $C_{int}$. This requires the gain to be set high enough to allow the charging of $C_{int}$ in a small fraction of the frame time. If desired, a more conventional snapshot circuit with a second integration capacitor can also be employed. Additionally, one embodiment of the present invention includes a source-follower amplifier at the pixel's output to buffer the signal read through the bus. This amplifier may not be necessary if the charge integrated in the cell is large enough.

The present solution can be integrated into the typical pixel pitches normally used for single-photon detection (from 40 μm to 125 μm) to amplify only the noise-free photo-generated signal for subsequent processing or display. The resulting video signal has large margin over the background noise of the camera electronics even at very low levels of ambient light without need for supplementary illumination.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The following description is provided to enable any person skilled in the art to make and use the invention and sets forth the best modes contemplated by the inventors for carrying out the invention. Various modifications, however, will remain readily apparent to those skilled in the art, since the basic principles of the present invention have been defined herein specifically to provide a low-noise, high-gain, wide dynamic range pixel amplifier with high bandwidth for single photon readout of various photodetectors in imaging arrays. Any and all such modifications, equivalents and alternatives are intended to fall within the spirit and scope of the present invention.

The present invention provides a high bandwidth, ultra low-noise pixel amplifier that is capable of single photon read-out of photodetectors in extremely low-light conditions, i.e. photon flux levels approaching zero photons per sampling period. This circuit can be used to effectively count incident photons on individual photodetectors, in an imaging array as the front-end to a conventional video system, or in high frame-rate wavefront sensors. One of the primary benefits of the present approach is that the circuit can use "off-the-shelf" photodetectors such as photodiodes or photoconductors that have gain $\leq 1$ rather than, for example, avalanche multiplication within the photodiode (avalanche photodiodes). Standard photodetectors with gain $\leq 1$ are cheaper, more uniform, easier to fabricate, more reliable, less susceptible to excess noise mechanisms within the detector, and support a much broader range of the electromagnetic spectrum than avalanche photodiodes.

Figure 1:
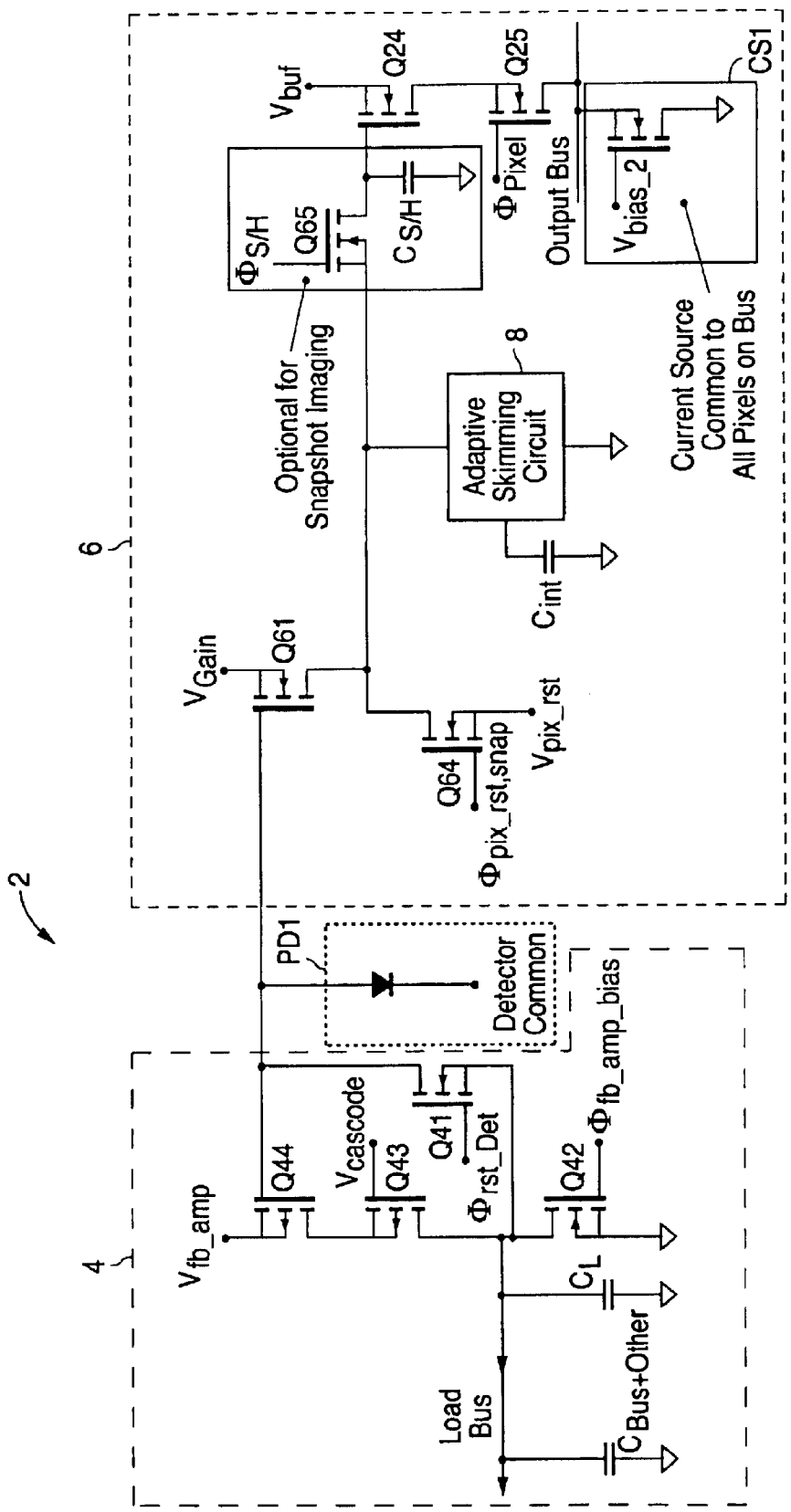
FIG. 1 is a schematic diagram of a first embodiment of an ultra-low noise, high gain, high-bandwidth pixel amplifier for single-photon readout of various photodetectors with either snapshot or focal-plane-shutter image formation.

FIG. 1 is a schematic of a first embodiment of the present invention. The left-most portion of the circuit 2 is a reset amplifier 4 that is implemented as a CMOS inverter. To reset the detector PD1, the amplifier 4 is enabled along with the reset transistor Q41. Negative feedback in conjunction with the small feedback capacitance of the amplifier's Miller capacitance and a large load capacitance $C_L$ (both internal and external to the pixel) nearly eliminate the kTC noise otherwise generated. Using an amplifier transistor of three to four times the minimum feature size in 0.25 μm CMOS technology effects a sub-1 fF Miller capacitance. Combining in parallel the in-cell $C_L$ with both the load bus capacitance and other capacitance external to the cell readily enables total load capacitance of 5 pF. Conservatively assuming a detector capacitance of 50 fF and substituting into the earlier equation for a reset integrator yields a residual reset noise of approximately 1 electron. The operation of the basic CMOS inverter is described below with reference to FIG. 4.

The rightmost portion of the circuit 2 is a high-gain read amplifier 6. After reset is completed the reset amplifier 4 is disabled and detector charge is allowed to integrate on the detector capacitance. The integrating signal modulates the gate of a current source transistor Q61 whose gain-proportioned current is integrated in the integration capacitor $C_{int}$ (part of the adaptive skimming circuit 8) for a programmed integration time. The integration capacitor $C_{int}$ is preferably formed from a MOSFET, with its source and drain connected. This integrated signal, whose Nyquist-limited noise is dominated by the shot noise of the amplified photosignal can thus be directly read to the bus or through an optional source follower Q24 bus.

As explained in more detail in U.S. patent application Ser. No. 09/675,278, entitled "SELF-ADJUSTING ADAPTIVE MINIMAL NOISE INPUT AMPLIFIER", filed Sep. 29, 2000, herein incorporated by reference, the non-uniformities in the integrated current are subtracted from the amplified signal pedestal by operation of the adaptive skimming circuit 8.

Though image formation is typically of a rolling-shutter or focal-plane-shutter type, snap-shot integration may be achieved by sampling the voltage accumulated on $C_{int}$ onto $C_{S/H}$ by enabling $\phi_{S/H}$ (on the sample-and-hold transistor Q65). The imaging array is subsequently reset synchronously by enabling $\phi_{pix\_reset}$ (on the pixel reset transistor Q64) to reset $C_{int}$ and $\phi_{rst\_Det}$ (on the detector reset transistor Q41) to reset the detector PD1. Since the front-end circuit 4 is a logarithmic amplifier, the integrator should be disabled during the reset processes. Therefore, $V_{Gain}$ should be disabled to prevent signal integration during reset.

Also, to facilitate snap-shot integration an additional current source CS1 may be added to each pixel cell. If snap-shot functionality is not needed, then this current source CS1 can be removed from each cell and a single current source placed on the common bus, in order to reduce the area of each pixel.

Figure 2:
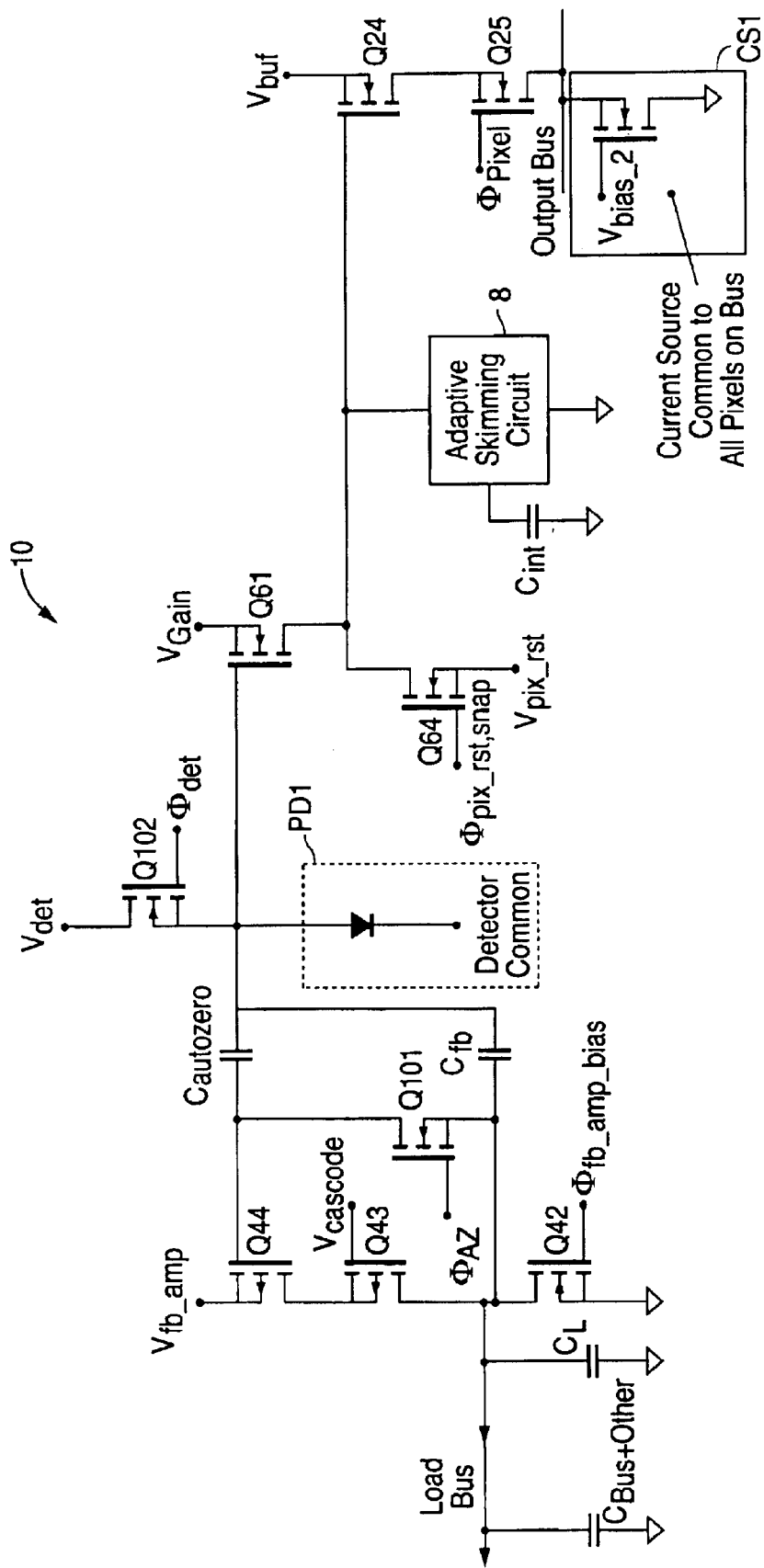
FIG. 2 is a schematic diagram of a second embodiment of an ultra-low noise, high gain, high-bandwidth pixel amplifier for single-photon readout of various photodetectors with either snapshot or focal-plane-shutter image formation.

FIG. 2 is a schematic of an alternative embodiment of the present invention. In this circuit 10, the charge integrator used to reset the detector PD1 provides an autozero feature to eliminate the programming of the amplifier offset non-uniformity onto the detector voltage. This is accomplished via the autozero transistor Q101, and the combination of $C_{autozero}$ and $C_{fb}$.

Figure 3:
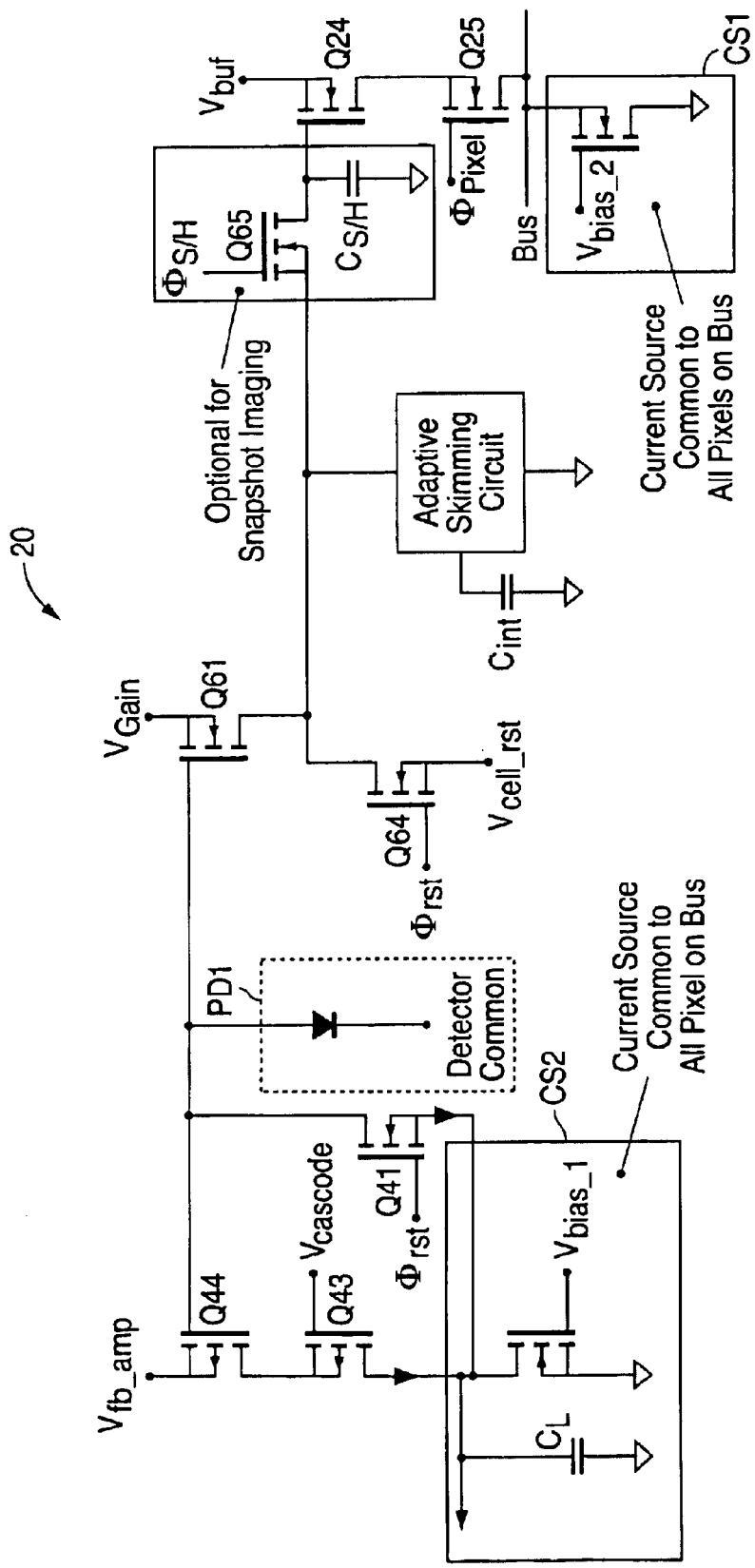
FIG. 3 is a schematic diagram of a third embodiment of an ultra-low noise, high gain, high-bandwidth pixel amplifier for single-photon readout of various photodetectors with preference for focal-plane-shutter rather than snapshot imager formation and compatibility with smaller pixel pitch.

FIG. 3 is a schematic of another alternative embodiment of the present invention. Here, the reset integrator is distributed between the pixel and an external circuit CS2 shared among all the pixels in a column. In this embodiment, the pixels must be reset on a row-by-row basis. While snapshot integration is still technically possible, rolling integration is preferred. By removing the potentially large $C_L$ capacitor from the pixel, a smaller pixel pitch is now feasible.

A simple calculation of the SNR one would expect from the various embodiments of the photon-reading circuit is given by:

$$SNR = \frac{qN_p}{C_{det}V_T} \sqrt{\frac{C_{int}V_{max}}{rq}}$$

where $C_{int}$ is the integration capacitance, $V_{max}$ is the maximum useable output voltage, r is the skim reduction ratio, q is the electronic charge, $N_p$ is the number of photogenerated charges on the diode, $C_{det}$ is the diode capacitance, and $V_T$ is the thermal voltage. For (in standard units) $C_{int}=1$ pF, $C_{det}=40$ fF, $V_T=25$ mK, $V_{max}=1$V, and r=0.1, then $$SNR=1.26 \cdot N_p$$

The SNR is thus 1.26 when one photon is present. Sub-electron read noise is reduced by using high-gain front-end with a current-nulling backend to suppress the otherwise dominant threshold voltage non-uniformity.

Figure 4:
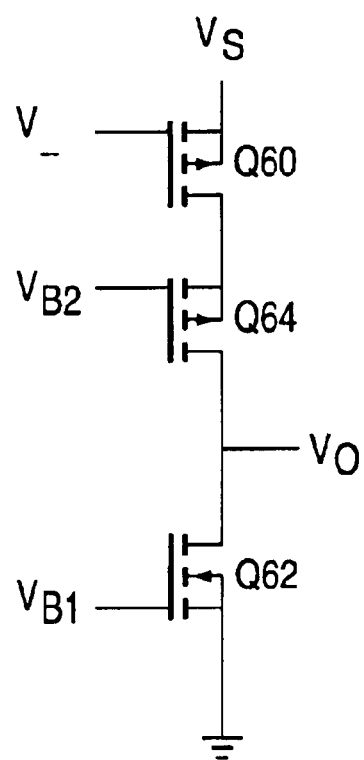
FIG. 4 is a schematic diagram of a CMOS inverter amplifier of the various embodiments for facilitating low noise detector reset via capacitive feedback.

In the single-ended CMOS inverter amplifier, shown separately in FIG. 4, an input signal V__, whose voltage is more negative than was previously present, causes the p-MOSFET driver Q60 (Q44 of FIG. 1) to conduct more strongly. In response, the amplifier's output voltage subsequently swings to a more positive potential since the load FETs (an n-MOSFET device Q62 (Q42 of FIG. 1) whose nominal operating resistance is set by gate voltage $V_{Gain}$) relative operating resistance will be proportionally larger than before. An input signal V_whose voltage is more positive causes the driver MOSFET Q60 to conduct less strongly; the resulting output voltage $V_o$ thus swings again in a direction opposite to that of the input signal. The open-loop gain of this inverter is the product of the amplifier transistor's conductance, $g_m$, and the load resistance, $r_d$, established by the load transistor and the downstream load. The open-loop gain of the cascoded CMOS inverter amplifier configuration, where cascode transistor Q64 is inserted between the output node $V_o$ and the drain of transistor Q60 is (for the case where p-MOSFET cascode transistor Q64 has identical geometry to the p-FET driver and is biased by gate voltage $V_{Gain}$):

$$A_v = -\left[\frac{g_m * r_d}{1 + \frac{r_d}{R_L}}\right] \quad (1)$$

Where $g_m$ is the transconductance of the amplifier transistor, $r_d$ is the drain-source resistance of the load MOSFET and $R_L$ is the load resistance at the amplifier output. Since this load is often purely capacitive for the intended application, i.e., the bus capacitance for the respective column or row of the imager, the denominator is often unity. In the absence of a cascode MOSFET, the gain is otherwise limited to $-g_m \cdot r_d$, as previously described.

Those skilled in the art will appreciate that various adaptations and modifications of the just-described preferred embodiments can be configured without departing from the scope and spirit of the invention. Therefore, it is to be understood that, within the scope of the appended claims, the invention may be practiced other than as specifically described herein.

What is claimed is:

1. A single photon read-out circuit comprising:
   a feed-back enhanced reset amplifier, the amplifier comprising a detector reset transistor;
   a photodetector connected to an output of the reset amplifier; and
   a high-gain amplifier connected to the photodetector, the high-gain amplifier comprising:
   a current source transistor connected to the photodetector;
   an adaptive skimming circuit having an integration capacitor; and
   a pixel reset transistor connected to the current source transistor and the adaptive skimming circuit.

2. The circuit of claim 1, further comprising a source follower transistor connected to the current source transistor.

3. The circuit of claim 2, wherein the reset amplifier further comprises a CMOS inverter.

4. The circuit of claim 3, further-comprising a sample-and-hold transistor and a sample-and-hold capacitor connected between the current source transistor and the source follower transistor.

5. The circuit of claim 1, wherein the reset amplifier further comprises an autozero transistor, a first capacitor, and a second capacitor.

6. The circuit of claim 4, wherein the high-gain amplifier further comprises a current source shared by all pixels on a bus.

7. The circuit of claim 6, wherein the reset amplifier further comprises a current source shared by all pixels on a bus.

8. A focal plane array (FPA) having a plurality of pixel cells, each pixel cell comprising:
   a feed-back enhanced reset amplifier, the feed-back amplifier comprising:
   a CMOS inverter; and
   a photodetector reset transistor connected to the CMOS inverter;
   a photodetector connected to an output of the reset amplifier; and
   a high-gain amplifier connected to the photodetector, the high-gain amplifier comprising:
   a current source transistor connected to photodetector;
   a pixel reset transistor connected to the current source transistor; and
   an adaptive skimming circuit having an integration capacitor;
   wherein the reset amplifier reduces kTC noise, and the high-gain amplifier nulls current associated with the photodetector to reduce signal non-uniformity.

9. A single photon read-out circuit comprising:
   a detector;
   a detector reset transistor having a drain connected to the detector;
   an inverter amplifier connected between the drain of the reset transistor and a source of the reset transistor;
   a current source transistor having a gate connected to the detector;
   a pixel reset transistor having a drain connected to the current source transistor; and
   an adaptive skimming circuit connected to the current source transistor and the pixel reset transistor, the adaptive skimming circuit comprising an integration capacitor.

10. The circuit of claim 9, further comprising a sample-and-hold transistor and a sample-and-hold capacitor connected to the current source transistor and the adaptive skimming circuit.

11. The circuit of claim 10, further comprising a source follower transistor having a source connected to sample-and-hold transistor.

12. The circuit of claim 9, further comprising a first capacitor connected between the drain of the reset transistor and the photodetector, and a second capacitor connected between the source of the reset transistor and photodetector.

13. The circuit of claim 9, further comprising a current source, shared by all pixels on a bus, connected to the reset transistor and the inverter amplifier.

* * * * *